United States Patent
Azadet et al.

(10) Patent No.: US 7,355,451 B2
(45) Date of Patent: Apr. 8, 2008

(54) COMMON-MODE SHIFTING CIRCUIT FOR CML BUFFERS

(75) Inventors: Kameran Azadet, Morganville, NJ (US); Fuji Yang, Holmdel, NJ (US); Chunbing Guo, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 30 days.

(21) Appl. No.: 11/141,337

(22) Filed: May 31, 2005

(65) Prior Publication Data

US 2006/0017468 A1    Jan. 26, 2006

Related U.S. Application Data

(60) Provisional application No. 60/590,624, filed on Jul. 23, 2004.

(51) Int. Cl.
*H03K 19/0175* (2006.01)

(52) U.S. Cl. .......................................... 326/83; 326/26

(58) Field of Classification Search ................. 326/26, 326/27, 82, 83, 112–115, 124–117
See application file for complete search history.

(56) References Cited

U.S. PATENT DOCUMENTS

| | | | | |
|---|---|---|---|---|
| 4,868,423 A | * | 9/1989 | Abdi ........................... | 326/127 |
| 5,909,127 A | | 6/1999 | Pearson et al. ............. | 326/115 |
| 5,963,084 A | * | 10/1999 | Eschauzier .................. | 327/553 |
| 5,977,800 A | | 11/1999 | Iravani ........................ | 326/115 |
| 6,028,454 A | | 2/2000 | Elmasry et al. ............. | 326/115 |
| 6,353,338 B1 | | 3/2002 | Fiedler et al. ................ | 326/83 |
| 6,462,590 B2 | | 10/2002 | Warwar ....................... | 327/108 |
| 6,677,784 B2 | | 1/2004 | Yang ........................... | 326/127 |
| 6,762,624 B2 | | 7/2004 | Lai ............................. | 326/115 |

OTHER PUBLICATIONS

Mizuno et al., A GHz MOS Adaptive Pipeline Technique Using MOS Current-Mode Logic, IEEE Journal of Solid-State Circuits, vol. 31, No. 6, Jun. 1996, 784-791.

Heydari et al., Design of Ultra High-Speed CMOS CML buffers and Latches, IEEE International Symposium on Circuits and Systems (ISCAS), May 2003, 208-211.

Tanabe et al., 0.18 μm CMOS 10-Gb/s Multiplexer/Demultiplexer ICs Using Current Mode Logic with Tolerance to Threshold Voltage Fluctuation, IEEE Journal of Solid-State Circuits, vol. 36, No. 6, Jun. 2001, 988-996.

(Continued)

*Primary Examiner*—Don Le
(74) *Attorney, Agent, or Firm*—Synnestvedt & Lechner LLP

(57) ABSTRACT

A common-mode shifting circuit for shifting the common-mode output voltage of a CML device to an arbitrary voltage is disclosed. A constant current source is provided at each output of the CML device. The constant current may be a positive or negative current, tending to raise or lower the common-mode output voltage, respectively. The constant current sources are preferably connected to an alternate voltage supply having a higher voltage than that the supply for the CML device. The invention further provides a method for adjusting the output signal of a current-mode logic circuit having two or more output ports, comprising the step of providing a constant current at each output port of the current-mode logic circuit, whereby the common-mode voltage at the output ports of said current-mode logic circuit is level-shifted.

21 Claims, 6 Drawing Sheets

OTHER PUBLICATIONS

Payam Heydari, "Design and Analysis of Low-Voltage Current-Mode Logic Buffers," IEEE International Symposium on Quality Electronic Design (ISQED), Mar. 2003, 293-298.

Musicer et al., MOS Current Mode Logic for Low Power, Low Noise CORDIC Computation in Mixed-Signal Environments, Proceedings of the 2000 International Symposium Low Power Electronics and Design, Rapallo, Italy, Jul. 25-27, 2000, ACM Press, 102-107.

Hemati et al., High Performance MOS Current Mode Logic Circuits, Ottawa-Carleton Institute for Electrical & Computer Engineering, Carleton University, Ottawa, Canada (downloaded from Internet)(date unknown).

Heydari et al., Design of Ultrahigh-Speed Low-Voltage CMOS CML Buffers and Latches, IEEE Transactions on VLSI Systems, vol. 12, No. 10, Oct. 2004, 1081-1093.

* cited by examiner

COMMON-MODE SHIFTING CIRCUIT FOR CML BUFFERS

CROSS-REFERENCES

This application claims the benefit of U.S. Provisional Application No. 60/590,624, filed Jul. 23, 2004.

FIELD OF THE INVENTION

The present invention relates generally to signal levels in current-mode logic circuits, especially in high-speed input/output interface circuits.

BACKGROUND OF THE INVENTION

In high-speed communications equipment, e.g., optical transceivers or high-speed input-output (I/O) interface circuits, current-mode logic ("CML") buffers are frequently employed to drive off-chip resistive loads. CML buffers generally are able to operate from relatively low power supplies and achieve very fast switching high speeds, e.g., greater than a gigahertz or several tens of gigahertz. Further, because CML buffers use differential signaling, they are relatively insensitive to common-mode noise.

A conventional CML buffer circuit is shown in FIG. 1. CML buffer 100 includes two local (on-chip) 50-ohm resistors R1 and R2, two input transistors Q1 and Q2, and a "tail current" transistor Q3. As shown in FIG. 1, resistors R1 and R2 are connected between a supply voltage VDDO and the current-supply (or "drain") terminals of transistors Q1 and Q2, respectively. The current-sink (or "source") terminals of transistors Q1 and Q2 are connected together at node A to the current-supply terminal of transistor Q3. Finally, the current-sink terminal of transistor Q3 is connected to ground.

Conventionally, CML buffer 100 has a differential input signal, formed from two single-ended signals DATA and DATA_B applied respectively to the control terminal ("gate") of transistors Q1 and Q2. In accordance with the differential signaling approach, input signals DATA and DATA_B have opposite polarities. CML buffer 100 further has two outputs OUT_B and OUT, which similarly form a differential signal. The outputs OUT_B and OUT of the CML buffer are further connected to off-chip resistors R3 and R4, that represent the termination impedance of a chip that receives the differential output signal.

In operation, a constant bias current $I_B$ is introduced to the CML buffer by transistor Q3. Current $I_B$ is predetermined and set by the bias level of the $I_B$ current source transistor. As is well-known in the art, current $I_B$ is provided by transistor Q3 via a current mirror connection.

By means of input signals DATA and DATA_B, current $I_B$ is steered either to the left branch formed by resistor R1 and transistor Q1 or to the right branch formed by resistor R2 and transistor Q2. For example, if input signal DATA is a logical value "one," or "high," while input signal DATA_B is a logical value "zero," or "low," the current through transistor Q1 will increase and the current through transistor Q2 will decrease (though not so much as to put transistor Q1 or Q2 in a cut-off or active state). Accordingly, because more current flows through resistor R1, a voltage drop across resistor R1 will develop, and the output OUT_B will take on a "low" value. At the same time, because less current flows through resistor R2, the voltage drop across resistor R2 will decrease, and output OUT will take on a "high" value. Alternatively, if input signal DATA is a logical "zero" signal, then current is steered through the right branch, and output OUT_B will take on a "high" value while output OUT takes on a "low" value.

In this conventional CML buffer, and with reference to FIG. 2, the voltage swing of each output signal (i.e., at outputs OUT and OUT_B) is from a maximum output voltage $V_{OH}$ (210 in FIG. 2) of approximately the supply voltage $V_{DDO}$ (also 210 in FIG. 2), down to a minimum output voltage $V_{OL}$ (230 in FIG. 2) obtained by subtracting the voltage drop across resistor R2 or R4 from $V_{DDO}$. The average value of the output signal (e.g., at output OUT) represents the "common-mode voltage" $V_{CM}$ of the output signal (220 in FIG. 2). Common-mode voltage $V_{CM}$ may be approximated by assuming equal current flow through the left branch and the right branch, with the following resultant circuit equation:

$$V_{CM} = V_{DDO} - (R2+R4)/2 * I_B/2,$$

where $V_{CM}$ is the common-mode voltage, $V_{DDO}$ is the supply voltage, R2 is the on-chip resistance, R4 is the off-chip resistance, and $I_B$ is the tail current. For example, for R1=R2=R3=R4=50 ohms, $V_{DDO}$=1.2 ohms and $I_B$=20 mA, the resulting common-mode voltage $V_{CM}$ would be 0.95 volts, which is relatively high (i.e., close to the supply voltage $V_{DDO}$). In addition, the peak-to-peak voltage $V_{pk}$ of the output signal (250 in FIG. 2) is the voltage at the highest output level $V_{OH}$ minus the voltage at the lowest output level $V_{OL}$. Maximum output voltage $V_{OH}$ is approximately the supply voltage $V_{DDO}$ (i.e., about 1.2 volts when transistor Q2 is "off"). Minimum output voltage $V_{OL}$ (when transistor Q2 is "on") may be determined as follows:

$$V_{OL} = V_{DDO} - (R2*R4)/(R2+R4)*I_B$$

where $V_{OL}$ is the voltage of the output signal OUT at its lowest output level, $V_{DDO}$ is the supply voltage, R2 and R4 are the on-chip and off-chip load resistances, respectively, and $I_B$ is the tail current. For the values used above, where R2=R4=50 ohms, and $I_B$=20 mA, the resulting minimum output voltage $V_{OL}$ would be 0.7 V. Thus, the peak-to-peak voltage $V_{pk}$ would be $V_{OH}$–$V_{OL}$, or 1.2V–0.7 V=0.5 volts.

A significant problem arises, however, when a CML buffer is connected to a receiver through a DC blocking capacitor (known as "AC coupling mode"). Such a connection is shown in FIG. 3. DC blocking capacitors C1 and C2 pass the AC part of the output signals at outputs OUT_B and OUT, but block the DC part of the signal. When the outputs OUT_B and OUT are AC coupled, the dynamic (AC) part of the signal "sees" the local 50-ohm resistance of resistor R1 or resistor R2 in parallel with the remote 50-ohm impedance of resistors R3 or R4, resulting in an equivalent AC impedance of 25 ohms for each output. Meanwhile, the DC part of the signal (i.e., the DC common-mode voltage) "sees" only the 50-ohm local impedance of resistor R1 or resistor R2. The relatively high 50-ohm impedance seen by the DC part gives rise to a relatively high voltage drop (or "IR" drop) of the common-mode voltage. Indeed, the DC impedance (50 ohms) is twice that of the AC equivalent impedance (25 ohms).

The common-mode voltage, maximum output level, and minimum output level for an AC-coupled CML buffer may be calculated in a similar manner as above. The common-mode voltage is:

$$V_{CM} = V_{DDO} - R2 * I_B/2 = 1.2\ V * 50\ ohms * 20\ mA /2 = 0.7\ V.$$

Assuming that C1 and C2 are large, the peak-to-peak voltage from an AC standpoint is about the same as above, or 0.5 V.

Because the AC voltage is superimposed on the lower DC common-mode voltage of 0.7 V, the maximum output voltage $V_{OH}$ here is 0.95 V and the minimum output voltage $V_{OL}$ is 0.45 V. The various voltages for the AC-coupled case are depicted graphically in FIG. 4. It may be seen from FIG. 4 that the AC differential signals at outputs OUT_B and OUT swing about the common-mode voltage $V_{CM}$ (430 in FIG. 4), up to $V_{OH}$ (420 in FIG. 4) and down to $V_{OL}$ (440 in FIG. 4) relative to ground 450.

It is clear from the foregoing that in the AC-coupled CML buffer, the DC common-mode output signal is significantly lower than in the DC-coupled case, while the AC output signal remains the same. The large downward shift in the common-mode voltage $V_{CM}$ negatively impacts the AC output signal, however, by limiting the headroom or voltage swing that is available. As a result, at low power supply voltages (for example, 1.2 volts or less), "clipping" or distortion of the output signal may occur. More particularly, in a CML buffer it is preferable to operate both the input transistors Q1 and Q2 and the tail-current transistor Q3 in saturation mode. The very low level of the minimum output voltage $V_{OL}$ (0.45 V), however, causes these transistors to tend to operate in active or cut-off mode, causing distortion or clipping.

One possible solution to the distortion problem caused by the lower common-mode voltage in AC-coupled CML devices is to increase the width to length ratio of transistors Q1, Q2 and Q3, so that they are kept in saturation mode even for relatively low common-mode voltages. In practice, however, the benefit of a high W/L ratio must be balanced against the parasitic capacitance of the devices, which increases as the W/L ratio increases and which tends to reduce the switching frequency of the devices. Thus, it would be desirable to provide an AC-coupled CML buffer that does not suffer from the low-common-mode voltage problem described above and that may operate at high frequencies.

SUMMARY OF THE INVENTION

Briefly described, the invention is a current-mode level-shifting circuit that can shift the common-mode output voltage of a CML device to an arbitrary voltage, preferably close to the voltage of the power supply rails. The circuit provides a common-mode output voltage that is well-suited for operation with low-voltage power supplies. In accordance with the invention, a constant current is provided at each output, respectively, of the CML device via a constant current source. If the constant current at each output is a positive current flowing into the output, the common-mode output voltage will be raised. Alternatively, if the constant current at each output is a negative current flowing out from the output, the common-mode voltage will be lowered. Preferably, the constant currents provided at the outputs are approximately the same. The constant current sources may be implemented as PMOS transistors biased to a condition sufficient to provide a current adequate to raise the common-mode voltage.

Thus, the invention may broadly be described as a current-mode shifting circuit, comprising a current-mode logic circuit having two input ports and two output ports having a common-mode voltage; and two constant-current sources, each connected respectively between the two output ports of said current-mode logic circuit and a first supply voltage. The constant-current sources produce currents at the output ports that shift the common-mode voltage at the output ports. In one embodiment, the first supply voltage is greater than the common-mode voltage at the output ports, such the constant current sources inject current into the output ports and thereby raise the common-mode voltage. Alternatively, the first supply voltage may be less than the common-mode voltage at the output ports, such that the constant current sources sink current from the output ports and thereby lower the common-mode voltage. The current-mode shifting circuit may further comprise two DC block capacitors, each connected respectively to the two output ports of the current-mode logic circuit, and capable of connection to a load termination.

In a further embodiment, the current-mode logic circuit is connected to a second supply voltage. Preferably, the first supply voltage (connected to the current sources) is equal to or greater than the second supply (connected to the current-mode logic circuit). The constant-current sources may then inject sufficient current into the output ports to raise the common-mode voltage at each output port to a sufficiently high value that the peak voltage at each output port of the current-mode logic circuit is greater than the first power supply voltage. It may still further include load resistors connected between the current sources and the output ports of the current-mode logic circuit. In this embodiment, it is also preferable to provide two resistors connected in series with the current sources. These resistors act as current-limiting resistors and buffer the current sources from output fluctuations.

The invention further provides a method for adjusting the output signal of a current-mode logic circuit having two output ports and connected to a first supply voltage. The method comprises the step of providing a constant current at each output of the current-mode logic circuit, whereby the common-mode voltage at the output ports of the current-mode logic circuit is level-shifted. The constant current may be a negative current flowing out of each output port, thus lowering the common-mode voltage, or may be a positive current flowing into each output port, thus raising the common-mode voltage. In this latter embodiment, the constant current injected at each output port preferably raises the common-mode voltage to a sufficiently high value that the peak voltage at each output port of the current-mode logic circuit is greater than the first power supply voltage. The method preferably also includes passing the constant current at each output port through a series resistor.

BRIEF DESCRIPTION OF THE DRAWINGS

Various embodiments of the present invention will now be described in detail in conjunction with the annexed drawings, in which.

DETAILED DESCRIPTION

Figure 1:
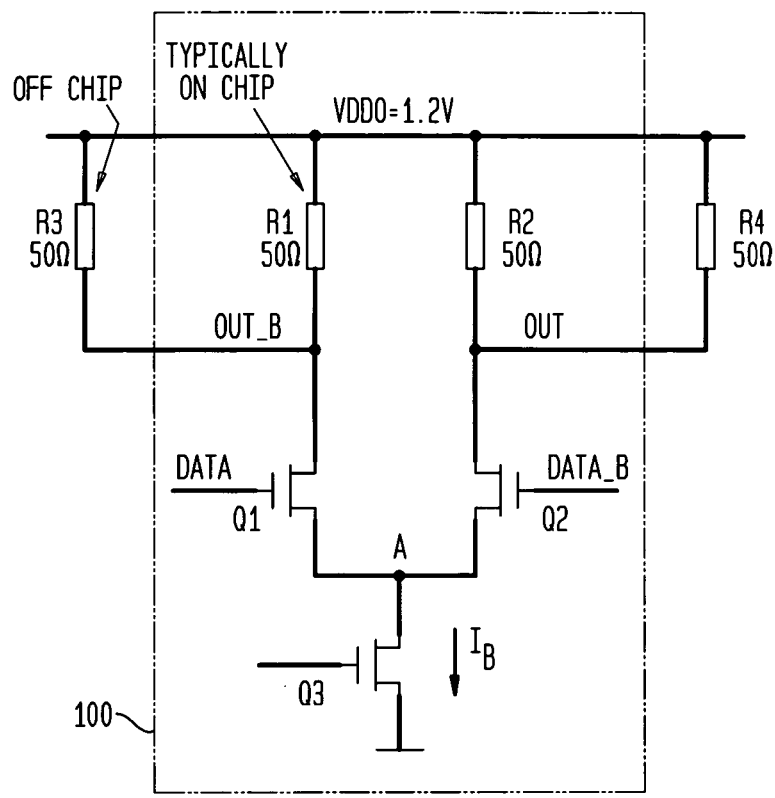
FIG. 1 is a circuit diagram of a prior art CML circuit having DC-coupled output terminations.
Figure 2:
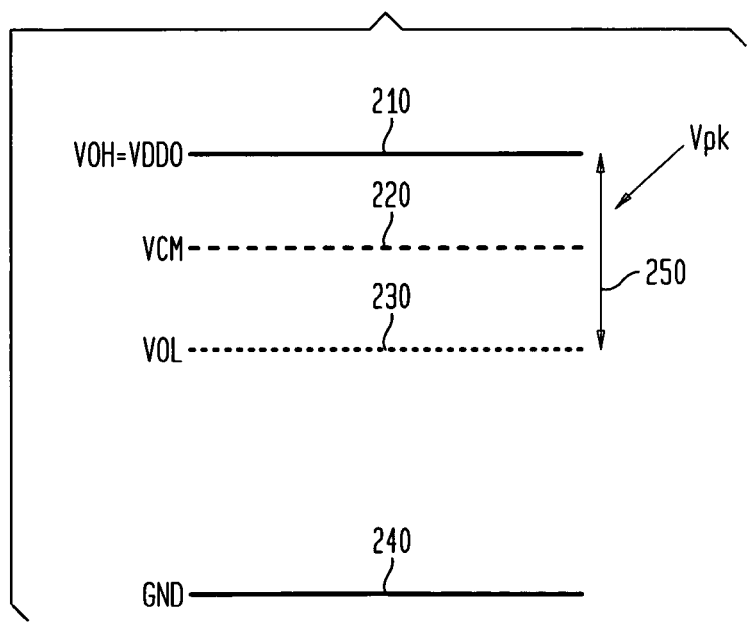
FIG. 2 is a graph depicting various voltages in the circuit shown in FIG. 1.
Figure 3:
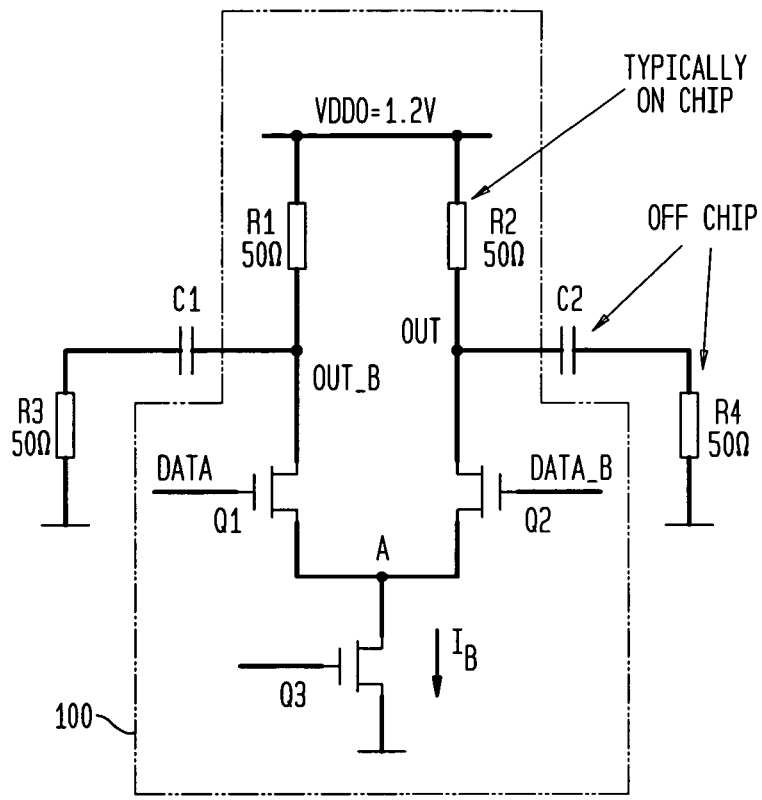
FIG. 3 is a circuit diagram of a prior art CML circuit having AC-coupled output terminations
Figure 4:
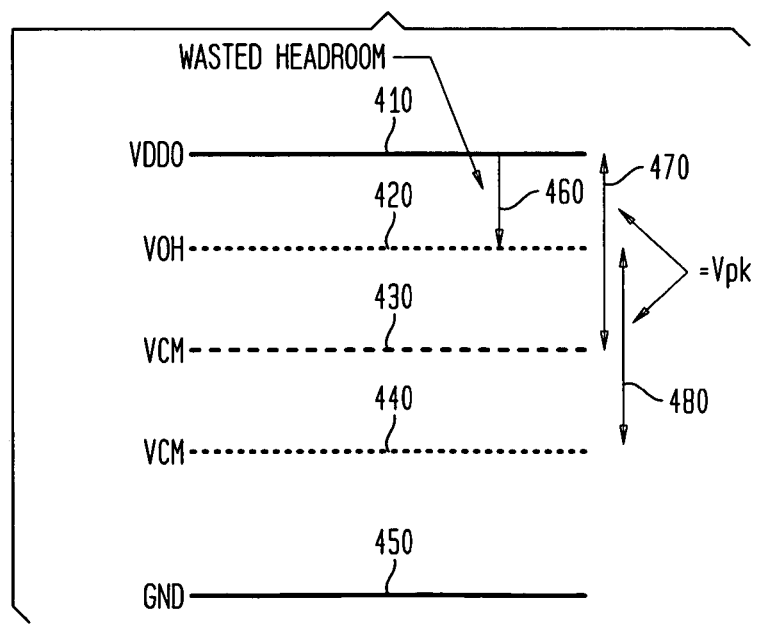
FIG. 4 is a graph depicting various voltages in the circuit shown in FIG. 3.
Figure 5:
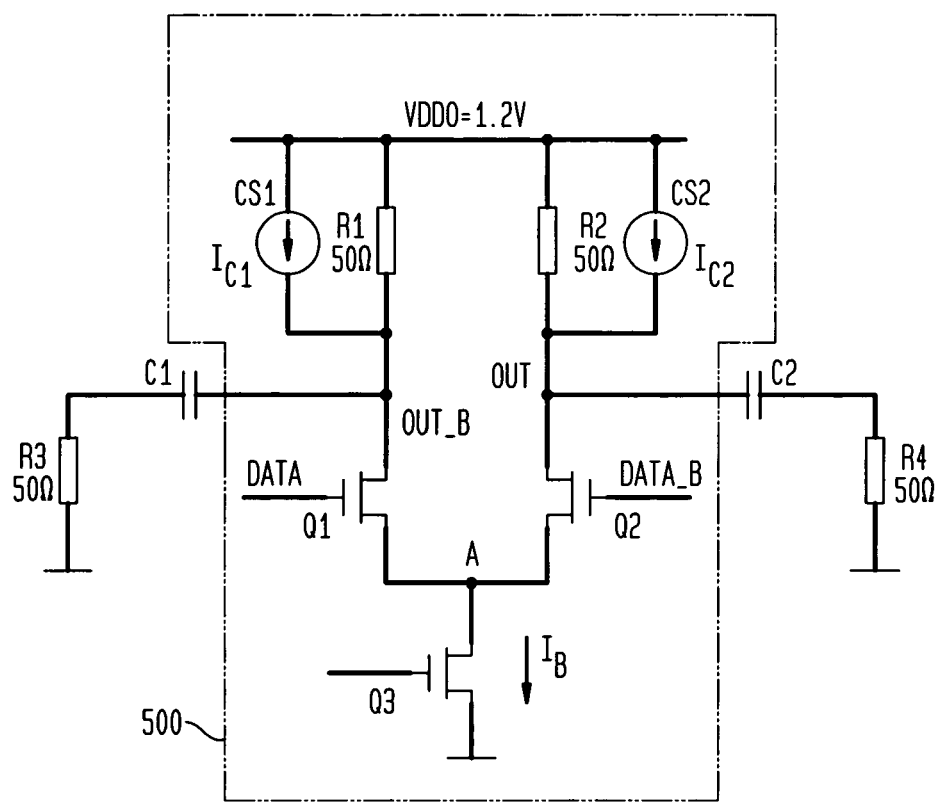
FIG. 5 is a circuit diagram of a current-mode shifting circuit in accordance with the invention.

A current-mode shifting circuit in accordance with the present invention is shown in FIG. 5. Similarly to CML buffer 100 described above, current-mode shifting circuit 500, includes two local (on-chip) 50-ohm resistors R1 and R2, two input transistors Q1 and Q2, and a "tail current" transistor Q3. Resistors R1 and R2 are connected between supply voltage $V_{DDO}$ and the current-supply (or "drain") terminals of transistors Q1 and Q2, respectively. The current-sink (or "source") terminals of transistors Q1 and Q2 are connected together at node A to the current-supply terminal of transistor Q3. The curren ground. In accordance with one embodiment of the invention, current-mode shifting circuit 500 further includes two constant-current sources CS1 and CS2, each connected respectively to the two outputs OUT_B and OUT of current-mode logic circuit 500.

Like CML buffer 100 described above, current-mode shifting circuit 500 receives a differential input signal, formed from two single-ended signals DATA and DATA_B applied respectively to the control terminal ("gate") of transistors Q1 and Q2, where input signals DATA and DATA_B have opposite polarities. Current-mode shifting circuit 500 further has two outputs OUT_B and OUT, which similarly form a single differential signal. The outputs OUT_B and OUT of the CML buffer are connected to off-chip resistors R3 and R4, representing the load impedance of a chip that receives the differential output signal, through DC blocking capacitances C1 and C2.

Current-mode shifting circuit 500 operates as follows. Like CML buffer 100, transistor Q3 in current-mode shifting circuit 500 provides an unswitched, constant bias current $I_B$, that causes input transistors Q1 and Q2 to operate in their saturation regions. By means of input signals DATA and DATA_B. current $I_B$ is steered either to the left branch formed by resistor R1 and transistor Q1 or to the right branch formed by resistor R2 and transistor Q2, as described above in connection with CML buffer 100. Thus, for example, if input signal DATA is a logical value "one," or "high," while input signal DATA_B is a logical value "zero," or "low," the current through transistor Q1 increases while the current through transistor Q2 decreases (though not so much as to put transistor Q1 or Q2 in their cut-off or active states). Accordingly, because more current flows through resistor R1, a voltage drop develops across resistor R1, and the output OUT_B takes on a "low" value. At the same time, because less current flows through resistor R2, the voltage drop across resistor R2 decreases, and output OUT takes on a "high" value. Alternatively, if input signal DATA is a logical "zero" signal, then current is steered through the right branch, and output OUT_B takes on a "high" value while output OUT takes on a "low" value.

In accordance with the present invention, constant current sources CS1 and CS2 simultaneously supply constant DC currents $I_{C1}$ and $I_{C2}$ to outputs OUT_B and OUT, respectively. These DC currents ($I_{C1}$ and $I_{C2}$) have the effect of sourcing some of the current demanded by transistor Q3, such that the currents through resistors R1 and R2 are correspondingly reduced (i.e., in the amount $I_{C1}$ or $I_{C2}$). More specifically, with the addition of constant current sources CS1 and CS2, the common-mode currents through resistors R1 and R2 take the value $I_B/2-I_{C1}$ and $I_B/2-I_{C2}$, respectively. As a result, because the voltage drop across resistors R1 and R2 is a function of the current passing through them, and because the common-mode voltages at outputs OUT_B and OUT the common-mode voltages at outputs OUT_B and OUT tend to increase proportionally as a function of $I_{C1}$ and $I_{C2}$. Indeed, due to the effects of electromagnetic coupling (both inductive and capacitive), the output signals at outputs OUT_B and OUT may even be caused to swing above the supply voltage $V_{DDO}$. Advantageously, because currents $I_{C1}$ and $I_{C2}$ are direct currents, rather than alternating currents, they do not pass through DC blocking capacitors C1 and C2 and thus have no effect on the peak-to-peak amplitude of the AC output signals.

Figure 6:
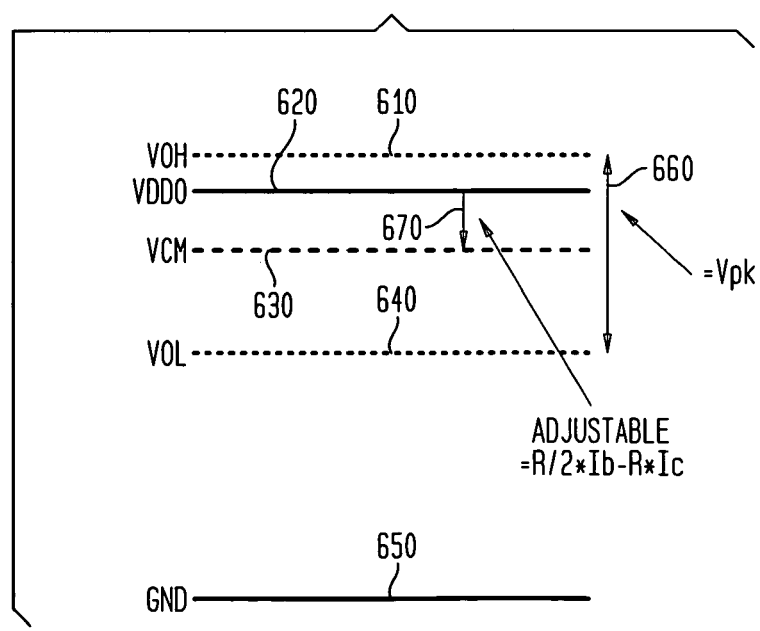
FIG. 6 is a graph depicting various voltages in the circuit shown in FIG. 5.

The various voltages in this embodiment of the present invention are depicted in FIG. 6. It may be seen that the common-mode voltage $V_{CM}$ (630 in FIG. 6) is adjustable, depending on the value of the constant currents $I_{C1}$ and $I_{C2}$. The voltage swing of each output signal (i.e., at outputs OUT and OUT_B) is from a maximum output voltage $V_{OH}$ (610 in FIG. 6)—which may be greater than the supply voltage $V_{DDO}$ (620 in FIG. 6)—down to a minimum output voltage $V_{OL}$ (640 in FIG. 6), all with reference to ground 650. The peak-to-peak amplitude $V_{pk}$ of the AC output signal (660 in FIG. 6) remains the same as with the convention CML circuit described above, but is shifted up with the common-mode voltage.

Figure 7:
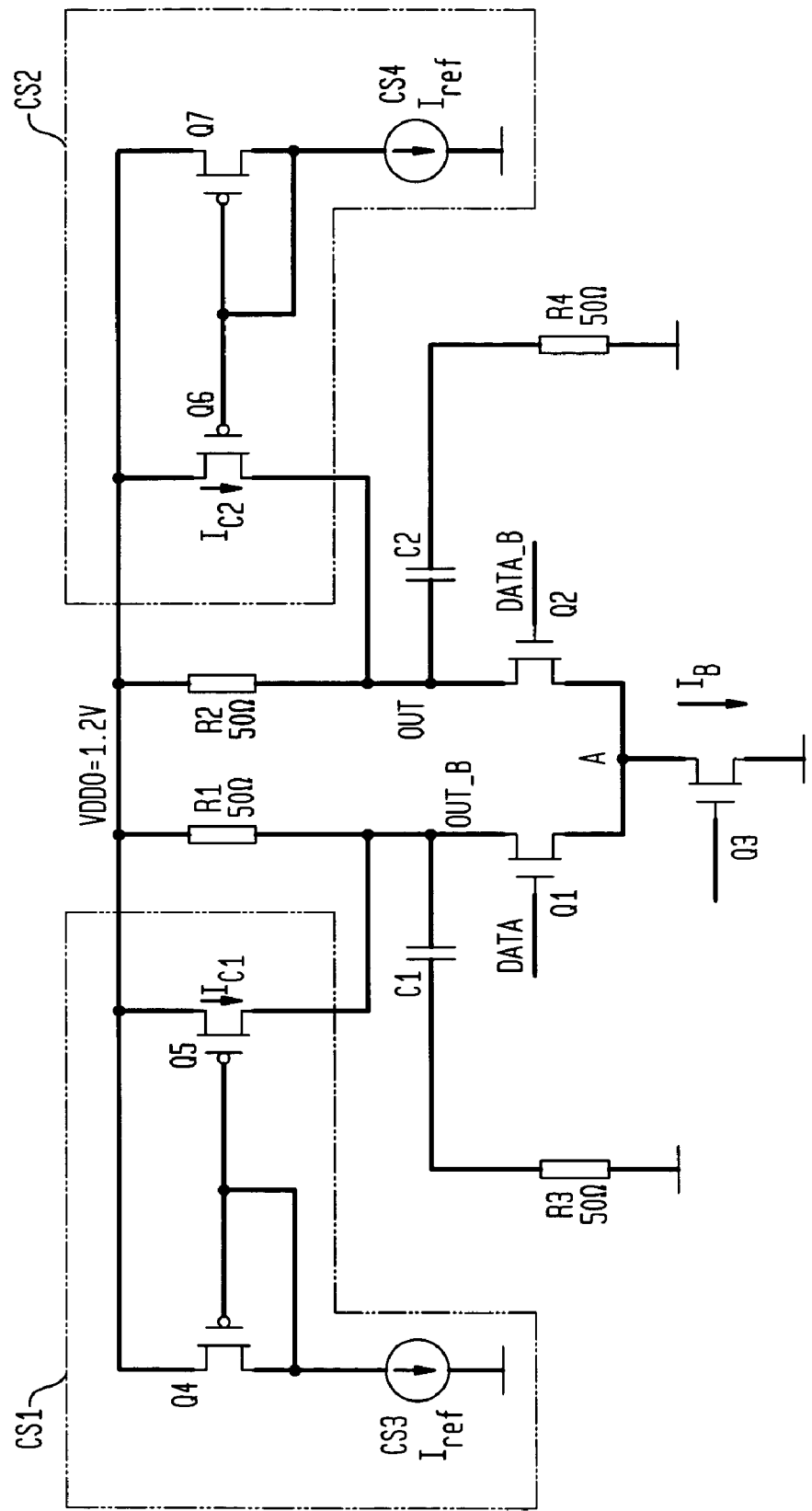
FIG. 7 is a circuit diagram of a preferred embodiment of the current-mode shifting circuit shown in FIG. 5.

Constant current sources CS1 and CS2 need not be implemented in any specific configuration, provided that each maintains a constant current notwithstanding the various voltages that may be present in common-mode shifting circuit 500. As an example, in FIG. 7 constant current source CS1 is implemented as a PMOS transistor Q5 in a current-mirror configuration with PMOS transistor Q4, wherein the current-supply ("drain") terminals of transistors Q4 and Q5 are connected to supply voltage $V_{DDO}$ and the control terminals ("gates") of transistors Q4 and Q5 are connected to each other and to the current-sink terminal ("source") of transistor Q4, and down to ground through reference current source $I_{ref}$. Thus, current $I_{C1}$ is predetermined and in essence set by the bias level of control terminal of transistor Q5. Constant current source CS2 may be implemented similarly. Preferably, currents $I_{C1}$ and $I_{C2}$ are as large as possible, so that the common-mode voltage is raised to the greatest extent possible, but not so large as to cause transistors Q5 and Q6 to fail to operate in saturation mode.

Figure 8:
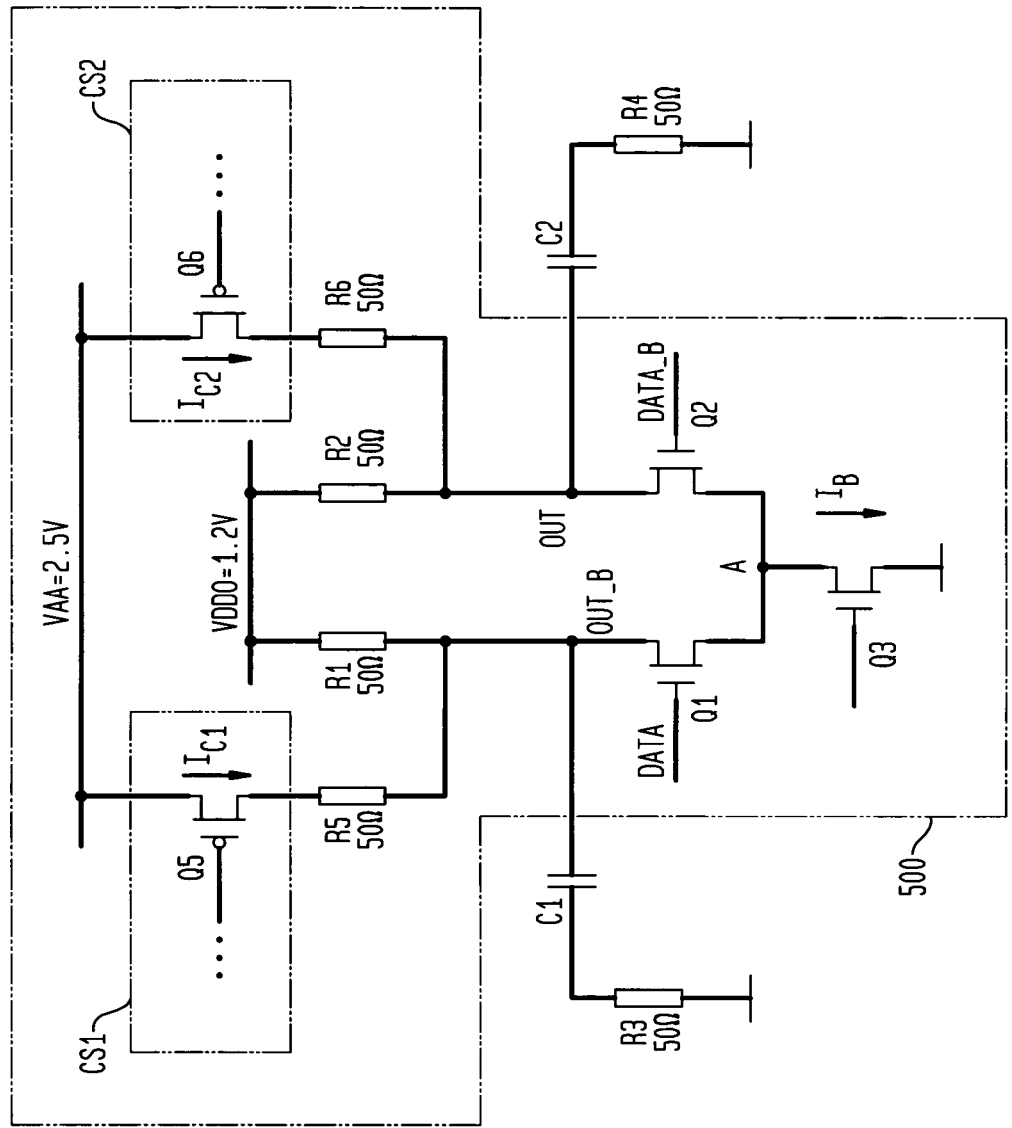
FIG. 8 is a circuit diagram of another embodiment of the current-mode shifting circuit in accordance with the present invention.

FIG. 8 depicts an alternative embodiment of the invention in which each constant current source CS1 and CS2 is connected to an additional voltage supply $V_{AA}$. In this configuration, if voltage supply $V_{AA}$ has a greater voltage than voltage supply $V_{DDO}$ (e.g., $V_{AA}$=2.5V), then the common mode voltage at outputs OUT and OUT_B may be raised to a voltage that approaches that of voltage supply $V_{DDO}$. The increased common mode voltage provides additional voltage headroom in the circuit, so that transistors Q1, Q2, and Q3 may be more easily kept in saturation mode. Additionally, with the additional headroom provided by supply voltage $V_{AA}$, transistors Q5 and Q6 may be made quite small relative to transistors Q1, Q2 and Q3 without causing transistors Q5 and Q6 not to operate in saturation mode. Advantageously, the use of the additional supply voltage $V_{AA}$ has little or no impact on the total power consumption by current-mode shifting circuit 500, because the total DC tail current $I_B$ remains the same.

Preferably, two additional resistors R5 and R6 are added in series with constant current sources CS1 and CS2, in order to isolate the outputs OUT and OUT_B from the parasitic capacitance created by transistors Q5 and Q6 in constant current sources CS1 and CS2, respectively. Without these resistors, the parasitic capacitances of transistors Q5 and Q6 tend to reduce the switching speed of current-mode shifting circuit 500 and to create impedance mismatch with the load terminations represented by resistors R3 and R4. The resistance of the additional resistors R5 and R6 may be of any value sufficient to satisfy the overall switching speed specifications or output impedance requirements of the circuit.

Figure 9:
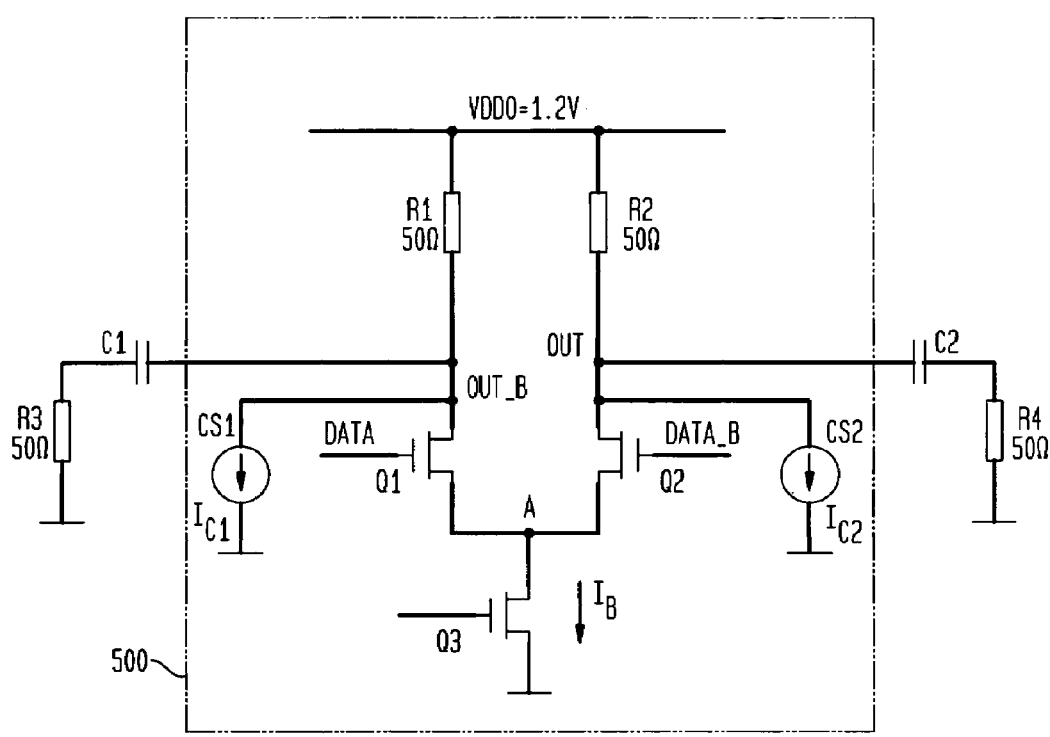
FIG. 9 is a circuit diagram of still another embodiment of the current-mode shifting circuit in accordance with the present invention.

FIG. 9 depicts an alternative embodiment of the invention, in which current sources CS1 and CS2 are connected between the outputs OUT_B and OUT, respectively, and a supply voltage that is lower than the common-mode voltage at outputs OUT_B and OUT. For example, as shown in FIG. 9, current sources CS1 and CS2 may be connected to ground. In this embodiment, constant current sources CS1 and CS2 act as constant current sinks that pull down or lower the common mode voltage at outputs OUT_B and OUT, respectively.

The invention may be used with bipolar or BiCMOS technologies, rather than CMOS process technology as depicted. The transistors may also be of opposite type as that described above (e.g., p-type transistors instead of n-type). Further, AC output terminations may be made to either $V_{DD}$, $V_{SS}$ or ground. The invention further may be applied to DC-coupled CML circuits in addition to AC-coupled circuits.

There has thus been described a current-mode shifting circuit capable of producing a high-speed communication signal with an improved common-mode voltage. It will be understood, however, that the foregoing description of the invention is by way of example only, and variations will be evident to those skilled in the art without departing from the scope of the invention, which is as set out in the appended claims.

What is claimed is:

1. A current-mode shifting circuit, comprising:
a current-mode circuit including two input ports and two output ports having a common-mode voltage;
a first supply port capable of receiving a first supply voltage; and
two constant-current sources, each connected between a respective one of the two output ports of said current-mode logic circuit and the first supply port;
whereby said constant-current sources produce currents that shift the common-mode voltage at said output ports;
wherein said first supply voltage is less than the common-mode voltage at said output ports, such that said constant current sources sink current from said output ports and thereby lower the common-mode voltage at said output ports.

2. The current-mode shifting circuit of claim 1, wherein said first supply voltage is ground.

3. A current-mode shifting circuit, comprising:
a current-mode circuit including two input ports and two output ports having a common-mode voltage;
a first supply port capable of receiving a first supply voltage; and
two constant-current sources, each connected between a respective one of the two output ports of said current-mode logic circuit and the first supply port;
a second supply port capable of receiving a second supply voltage having a non-zero voltage potential, wherein said current-mode circuit is connected to said second supply port;
whereby said constant-current sources produce currents that shift the common-mode voltage at said output ports.

4. The current-mode shifting circuit of claim 3, wherein said first supply voltage is larger in magnitude than the second supply voltage.

5. The current-mode shifting circuit of claim 4, wherein said constant-current sources inject sufficient current into said output ports to raise the common-mode voltage to a sufficiently high value that the peak voltage at each output port of said current-mode circuit is greater than said second supply voltage.

6. A current-mode shifting circuit, comprising:
a current-mode circuit including two input ports and two output ports having a common-mode voltage;
a first supply port capable of receiving a first supply voltage; and
two constant-current sources, each connected between a respective one of the two output ports of said current-mode logic circuit and the first supply port, whereby said constant-current sources produce currents that shift the common-mode voltage at said output ports; and
two DC block capacitors, each connected to a respective one of the two output ports of the current-mode circuit, and capable of connection to a load termination.

7. A current-mode shifting circuit, comprising:
a current-mode circuit including two input ports and two output ports having a common-mode voltage;
a first supply port capable of receiving a first supply voltage;
two constant-current sources, each connected between a respective one of the two output ports of said current-mode logic circuit and the first supply port, whereby said constant-current sources produce currents that shift the common-mode voltage at said output ports; and
two resistors, each connected in series with a respective one of said current sources.

8. The current-mode shifting circuit of claim 6 or 7, wherein said current-mode circuit is a logic circuit.

9. The current-mode shifting circuit of claim 8, wherein said current-mode circuit is a current-mode-logic circuit.

10. The current-mode shifting circuit of claim 9, wherein said current-mode circuit is a current-mode-logic buffer circuit.

11. A current-mode shifting circuit, comprising:
a current-mode circuit including two input ports and two output ports having a common-mode voltage;
a first supply port capable of receiving a first supply voltage; and
two constant-current sources, each connected between a respective one of the two output ports of said current-mode logic circuit and the first supply port, whereby said constant-current sources produce currents that shift the common-mode voltage at said output ports;
wherein said current-mode circuit includes:
two load resistors, each connected to a supply voltage;
two input transistors, each having a current-supply terminal, a current-sink terminal, and a control terminal, wherein the current-supply terminal of each input transistor is connected to a respective one of said load resistors and to a respective one of the output ports of said current-mode circuit; and
a tail current transistor having a current-supply terminal, a current-sink terminal, and a control terminal, wherein the current-supply terminal of said tail current transistor is connected to the current-sink terminals of said input transistors.

12. The current-mode shifting circuit of claim 11, further comprising:
two input signals, each connected to a respective one of the control terminals of said input transistors, wherein said input signals have opposite polarities, thus forming a single differential input signal, and
two output signals, each connected to a respective one of the output ports of said current-mode circuit, wherein said output signals have opposite polarities, thus forming a single differential output signal.

13. A method for adjusting the output signal of a current-mode circuit having two or more input ports and two or more output ports and capable of connection to a first supply voltage, comprising the step of:
providing a constant current at each output port of said current-mode circuit, whereby the common-mode voltage at the output ports of said current-mode circuit is level-shifted;
wherein the constant current is a current flowing out of each output port of said current-mode logic circuit, whereby the common-mode voltage at the output ports of said current-mode logic circuit is lowered.

14. A method for adjusting the output signal of a current-mode circuit having two or more input ports and two or more output ports and capable of connection to a first supply voltage, comprising the step of:
providing a constant current at each output port of said current-mode circuit, whereby the common-mode voltage at the output ports of said current-mode circuit is level-shifted;
wherein the constant current at each output port raises the common-mode voltage to a sufficiently high value that the peak voltage at each output port is greater than the first power supply voltage.

15. A method for adjusting the output signal of a current-mode circuit having two or more input ports and two or more output ports and capable of connection to a first supply voltage, comprising the steps of:
providing a constant current at each output port of said current-mode circuit; and
passing the constant current at each output port through a series resistor;
whereby the common-mode voltage at the output ports of said current-mode circuit is level-shifted.

16. The method of claim 13, 14 or 15, further comprising the steps of:
providing an input signal at each of the two or more input ports of said current-mode circuit; and
receiving an output signal from each of the two or more output ports of said current-mode circuit.

17. The method of claim 16, wherein said input signals have opposite polarities, thus forming a differential input signal, and wherein said output signals have opposite polarities, thus forming a differential output signal.

18. The method of claim 16, further comprising the steps of:
providing two or more load resistors;
providing a constant tail current; and
based on said input signals at said input ports, steering said constant tail current through one of said load resistors.

19. The method of claim 16, further comprising the step of providing a logic signal to at least one of said input ports.

20. The method of claim 16, wherein said current-mode circuit is a current-mode-logic circuit.

21. The method of claim 20, wherein said current-mode circuit is a current-mode-logic buffer.

* * * * *